US006876679B1

(12) United States Patent
Bowler et al.

(10) Patent No.: US 6,876,679 B1
(45) Date of Patent: Apr. 5, 2005

(54) SYSTEMS AND METHODS OF OPERATING AN INCOHERENTLY BEAM COMBINED LASER

(76) Inventors: Dennis Bowler, 220 Morse Rd., Sudbury, MA (US) 01776; Jorah Wyer, 908 Southerly Rd., Apt. #2, Towson, MD (US) 21204

( * ) Notice: Subject to any disclaimer, the term of this patent is extended or adjusted under 35 U.S.C. 154(b) by 1 day.

(21) Appl. No.: 10/224,310

(22) Filed: Aug. 20, 2002

(Under 37 CFR 1.47)

Related U.S. Application Data

(60) Provisional application No. 60/316,812, filed on Aug. 31, 2001, and provisional application No. 60/313,774, filed on Aug. 20, 2001.

(51) Int. Cl.[7] .................................................. H01S 3/10
(52) U.S. Cl. ........................ 372/9; 372/3; 372/43; 372/44; 372/45; 372/46; 372/47; 372/48; 372/49; 372/50; 372/96; 372/101; 372/102
(58) Field of Search ..................... 372/3, 9, 43–50, 372/96, 101, 102

(56) References Cited

U.S. PATENT DOCUMENTS

| | | | | | |
|---|---|---|---|---|---|
| 4,791,927 | A | * | 12/1988 | Menger ........................... | 606/3 |
| 5,530,711 | A | * | 6/1996 | Scheps .......................... | 372/20 |
| 5,691,989 | A | * | 11/1997 | Rakuljic et al. .............. | 372/20 |
| 6,025,915 | A | * | 2/2000 | Michal et al. .............. | 356/460 |
| 6,084,626 | A | * | 7/2000 | Ramanujan et al. ......... | 347/239 |
| 6,292,606 | B1 | * | 9/2001 | Riant et al. .................... | 385/37 |
| 6,404,798 | B1 | * | 6/2002 | Leckel et al. ................ | 372/108 |
| 6,525,872 | B1 | * | 2/2003 | Ziari et al. ................ | 359/341.3 |
| 6,597,711 | B2 | * | 7/2003 | Fernald et al. ................. | 372/20 |
| 6,597,712 | B2 | * | 7/2003 | Tatsuno et al. ................ | 372/32 |
| 6,693,272 | B2 | * | 2/2004 | Adachi et al. .............. | 250/216 |

OTHER PUBLICATIONS

U.S. Provisional Application No. 60/316,812.
U.S. Provisional Application No. 60/313,774.

* cited by examiner

*Primary Examiner*—Minsun Oh Harvey
*Assistant Examiner*—Delma R. Flores-Ruiz
(74) *Attorney, Agent, or Firm*—Fulbright & Jawoarksi LLP

(57) ABSTRACT

In embodiments, the present invention is directed to systems and methods for operating an incoherently beam combined (IBC) laser. The IBC laser may comprise an integrated set of emitters or a set of discrete emitters. Each emitter is associated with a high-pass, low-pass, or bandpass optical filter. The emitters and filters are disposed in an ordered arrangement thereby defining a common optical path. Near the end of the common optical path, a focusing lens may be utilized to focus the output beams from each of the emitters into a fiber. A partially reflective component may be embedded in the fiber to provide feedback to each of the emitters. By selecting the optical characteristics of the filters, light originating from a specific emitter is fed back to the same emitter and to no other emitter. Accordingly, multiple external laser cavities are created on the same optical path.

38 Claims, 5 Drawing Sheets

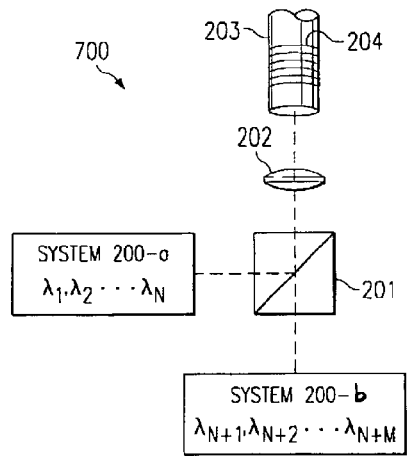
FIG. 7
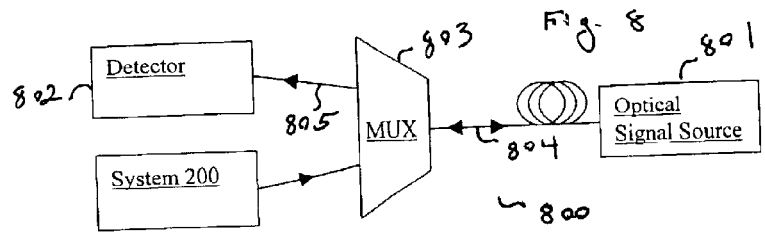
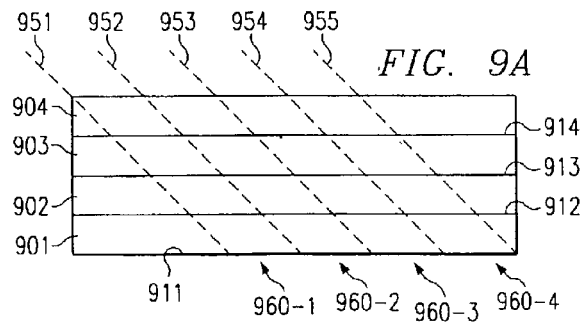
FIG. 9A

SYSTEMS AND METHODS OF OPERATING AN INCOHERENTLY BEAM COMBINED LASER

RELATED APPLICATIONS

This application claims the benefit of U.S. Provisional Application Ser. No. 60/316,812, filed Aug. 31, 2001 entitled "INDIVIDUAL EMITTERS IN IBC LASERS," and U.S. Provisional Application Ser. No. 60/313,774, filed Aug. 20, 2001 entitled "SYSTEMS AND METHOD FOR MULTIPLEXING OUTPUT BEAMS OF LASER DIODE CELLS."

FIELD OF THE INVENTION

The present invention is directed in general to systems and methods for incoherently combining a plurality of output beams.

BACKGROUND OF THE INVENTION

At the present time, telecommunication systems are largely based on fiber optic cables. For example, optical networks based on fiber optic cables are currently utilized to transport Internet traffic and traditional telephony information. In such applications, it is frequently necessary to provide an optical signal over significant distances (e.g., hundreds of kilometers). As optical signals travel through the optical fibers, a portion of their power is transferred to the fiber, scattered, or otherwise lost. Over appreciable distances, the optical signals become significantly attenuated. To address the attenuation, optical signals are amplified. Typical optical amplifiers include rare earth doped amplifiers (e.g., Erbium-doped fiber amplifiers).

Raman amplifiers may be utilized. A Raman amplifier relies upon the Raman scattering effect. The Raman scattering effect is a process in which light is frequency downshifted in a material. The frequency downshift results from a nonlinear interaction between light and the material. The difference in frequency between the input light and the frequency downshifted light is referred to as the Stokes shift which in silica fibers is of the order 13 THz.

When photons of two different wavelengths are present in an optical fiber, Raman scattering effect can be stimulated. This process is referred to as stimulated Raman scattering (SRS). In the SRS process, longer wavelength photons stimulate shorter wavelength photons to experience a Raman scattering event. The shorter wavelength photons are destroyed and longer wavelength photons, identical to the longer wavelength photons present initially, are created. The excess energy is conserved as an optical phonon (a lattice vibration). This process results in an increase in the number of longer wavelength photons and is referred to as Raman gain.

The probability that a Raman scattering event will occur is dependent on the intensity of the light as well as the wavelength separation between the two photons. The interaction between two optical waves due to SRS is governed by the following set of coupled equations:

$$\frac{dI_P}{dz} = \frac{\lambda_S}{\lambda_P} g_R I_S I_P - \alpha_P I_P$$

$$\frac{dI_S}{dz} = g_R I_S I_P - \alpha_S I_S$$

where $I_S$ is the intensity of the signal light (longer wavelength), $I_P$ is the intensity of the pump light (shorter wavelength), $g_R$ is the Raman gain coefficient, $\lambda_S$ is the signal wavelength, $\lambda_P$ is the pump wavelength, and $\alpha_S$ and $\alpha_P$ are the fiber attenuation coefficients at the signal and pump wavelengths respectively. The Raman gain coefficient, $g_R$, is dependent on the wavelength difference $(\lambda_S - \lambda_P)$ as is well known in the art.

As is well understood in the art, SRS is useful for generating optical gain. Optical amplifiers based on Raman gain are viewed as promising technology for amplification of WDM and DWDM telecommunication signals transmitted on optical fibers. Until recently, Raman amplifiers have not attracted much commercial interest because significant optical gain requires approximately one watt of optical pump power. Lasers capable of producing these powers at the wavelengths appropriate for Raman amplifiers have come into existence only over the past few years. These advances have renewed interest in Raman amplifiers.

Existing high power lasers dispose individual discrete lasers in, for example, 14 pin butterfly packages. The output beams from the individual devices are either polarization division multiplexed or wavelength division multiplexed into a single beam. To the extent that these systems multiplex more beams, the systems are able to generate a higher power output beam. In addition, WDM and DWDM telecommunications systems operate over large bandwidth ranges and require broad wavelength pump lasers to effectively use Raman amplification. These multiplexing schemes address this by operating at multiple wavelengths. However, these lasers become quite cumbersome and costly when the number of butterfly packages exceeds a relatively small number. Accordingly, the power that that can be achieved cost-effectively is limited.

Another type of high power laser is referred to as an incoherently beam combined (IBC) laser. An example of a known IBC laser is described in U.S. Pat. No. 6,208,679. Known IBC lasers utilize a dispersive external cavity and various optics to selectively provide feedback to emitters of a unitary emitter array. The selective feedback causes emitters of the unitary emitter to laser across a relatively broad, although limited, spectrum. Additionally, the dispersive external cavity and optics multiplex output beams from emitters of the unitary emitter array.

BRIEF SUMMARY OF THE INVENTION

In embodiments, the present invention is directed to systems and methods for multiplexing the output beams from a plurality of laser cells. Each cell advantageously comprises a laser diode, a detector for measuring back facet power, a collimator lens, and a high-pass, low-pass, or bandpass optical filter. Each cell is advantageously disposed in an ordered arrangement in association with a common optical path. Within the arrangement, the filters of the cells selectively transmit a predefined wavelength range. The frequencies that are not passed by the filters are reflected by the filters.

Moreover, the cells are oriented on a platform such that light from a given cell is reflected by its own filter. The filter then transmits the light from each cell before it onto the next cell. At the end of the daisy-chained group of cells, a focusing lens is utilized to focus the output beams from each of the cells into a fiber. A partially reflective component (e.g., a fiber Bragg grating) may be embedded in the fiber to provide feedback to each of the laser cells. In this manner, light originating from a specific cell is advantageously fed back to the same cell and to no other cell. Accordingly, multiple external laser cavities are created on the same optical path. It shall be appreciated that the operating wavelength or wavelengths of each cell are determined, in part, by the wavelengths that its filter allows to pass.

In other embodiments, a similar daisy-chain configuration is utilized. However, the filter of each cell transmits the output beam generated by its laser diode. Also, the filter reflects the output beams generated by the laser diodes of each previous cell.

Embodiments of the present invention may provide several advantages. Specifically, embodiments of the present invention generate a high power, multi-wavelength output beam. Moreover, each cell may be manufactured separately using the same tooling and assembly process. The components of the cells may advantageously be interchangeable. Moreover, the cell size is advantageously selected in a manner to place the cells in an individual butterfly package to be fiber coupled using a focusing lens. Accordingly, embodiments of the present invention enable a high power multiple wavelength beam to be generated from a relatively small device at a low cost. Embodiments of the present invention may be utilized for any number of applications such as providing a pump for Erbium-Doped Fiber Amplifiers (EDFAs) or Raman gain amplifiers.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristics of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 7 depicts a multi-cavity incoherently beam combined laser according to embodiments of the present invention;

FIG. 8 depicts an optical communication system that comprises an amplifier according to embodiments of the present invention;

FIG. 9A depicts a plurality of plates that may be utilized for fabrication of an optical component to be used in an incoherently beam combined laser incoherently according to embodiments of the present invention;

DETAILED DESCRIPTION OF THE INVENTION

Figure 1:
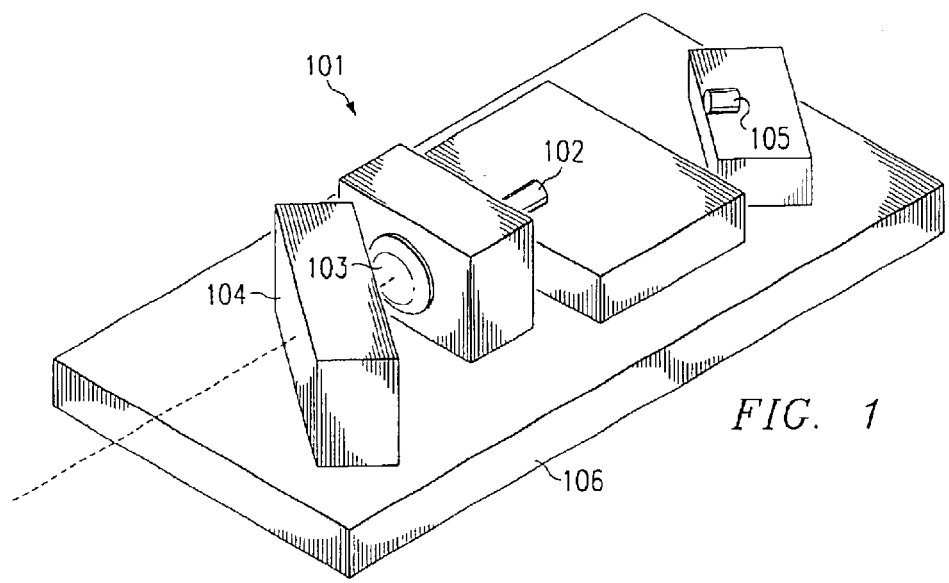
FIG. 1 depicts a laser diode cell according to embodiments of the present invention.

The present invention is directed to systems and methods for multiplexing the output beams of a plurality of laser diode cells. As depicted in FIG. 1, each cell 101 comprises a number of components mounted on substrate 106 including laser diode 102. Laser diode 102 may comprise any suitable semiconductor or other lasing material including but not limited to GaAlAs, GaAs, InP, InGaAs, InGaAsP, AlGaInAs, and/or the like. Additionally, laser diode 102 may be implemented utilizing any number of designs such as edge emitters, vertical cavity surface emitting lasers (VCSELs), and grating surface emitting lasers.

Furthermore, cell 101 may comprise detector 105 for determining the back facet optical power. The back facet optical power may be utilized to determine the amount of power launched into an optical fiber by the multiplexing systems and methods for the wavelength or wavelengths of light generated by the particular cell 101. The back facet may be utilized to vary the power to laser diode 102 to spectrally tailor the multiplexed output beams launched into an optical fiber (not shown).

Each cell 101 may comprise collimator 103 to collimate the light emitted by laser diode 102. Any suitable optical collimating component may be utilized for collimator 103 such as a collimating lens.

Each cell 101 advantageously comprises filter 104. Filter 104 may be implemented utilizing a dielectric film or films, although any suitable wavelength-dependent coating or filter may be utilized. Filter 104 possesses a selected wavelength response as will be discussed in greater detail with respect FIGS. 4A through 4C and FIGS. 5A through 5C. For example, filter 104 may be a high-pass filter, a low-pass filter, or a notch filter.

Figure 2:
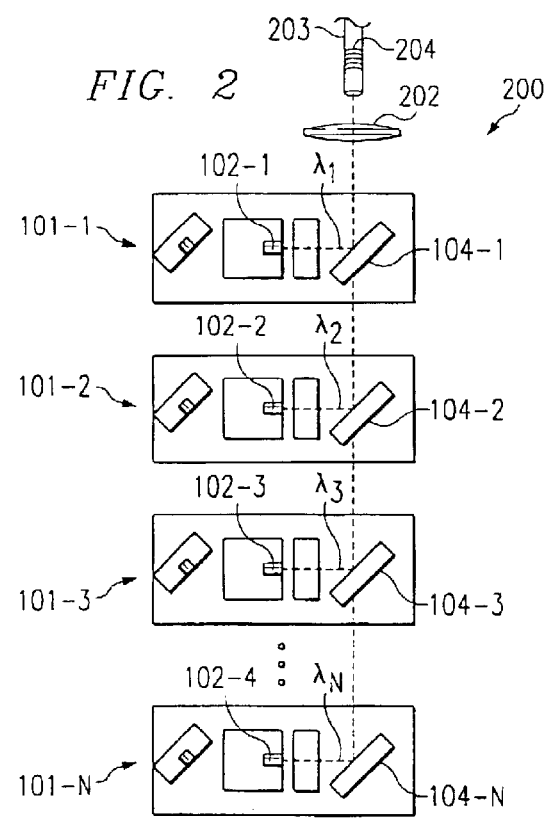
FIG. 2 depicts an incoherently beam combined laser according to embodiments of the present invention.

FIG. 2 depicts an exemplary block diagram according to embodiments of the present invention. System 200 depicts a linear arrangement of cells 101-1 through 101-N. The output beam from each cell 101 may be incident on its filter 104 at a forty-five degree angle. Also, the wavelength of each output beam is depicted by $\lambda_1$. For case of discussion, it is assumed that the wavelengths of cells 101-1 through 101-N are arranged in a monotonic order, $\lambda_1<\lambda_2<\lambda_3< \ldots \lambda_N$ or $\lambda_1>\lambda_2>\lambda_3> \ldots \lambda_N$. However, it shall be appreciated that the present invention does not require a monotonic arrangement as filters 104 may be implemented as notch filters. Specifically, as will be discussed in greater detail below, the wavelengths ($\lambda_I$) are largely controlled by the selection of filters 104-1 through 104-N.

The optical properties of filters 104-1 through 104-N are selected to permit each filter to reflect the wavelength $\lambda_1$) associated with its cell 101. Additionally, the optical properties of filters 104-1 through 104-N are selected to permit each filter to transmit the wavelengths ($\lambda_{I+1}$ through $\lambda_N$) associated with each previous cell 101-I+1 through 101-N.

By arranging cells 101 in the configuration shown in FIG. 2 and by selecting the optical properties of filters 104, the output from the laser diodes may be multiplexed. Specifically, filter 104 of each cell 101 transmits the output of each previous cell 101. This process is repeated until cell 101-1. After cell 101-1, the various output beams encounter fiber coupling lens 202. Fiber coupling lens 202 focuses the output beams from each of cells 101-1 through 101-N into optical fiber 203 to multiplex the beams.

Within optical fiber 203, fiber Bragg grating 204 is embedded to provide a partially reflective component. Fiber Bragg grating 204 is a broadband partially reflective grating to thereby reflect each of the wavelengths ($\lambda_1$ through $\lambda_N$) associated with cells 101-1 through 101-N. Fiber Bragg grating 204 transmits a portion of the optical power associated with wavelengths ($\lambda_1$ through $\lambda_N$). The transmitted power may be utilized for any desired application. For example, the transmitted power may be utilized to pump either an EDFA or a Raman amplifier. Additionally, fiber Bragg grating 204 reflects a portion of the optical power associated with wavelengths ($\lambda_I$ through $\lambda_N$) as feedback for laser diodes 102-1 through 102-N. Accordingly, this configuration is referred to as an external cavity laser. Although fiber Bragg grating 204 is shown, any suitable partially reflective component may be utilized.

The feedback provided by fiber Bragg grating 204 is returned to the cells 101-I through 101-N. Specifically, the feedback is controlled by filters 104-1 through 104-N such that the wavelength, $\lambda_I$, is returned to the same cell 104-I that emitted that wavelength, $\lambda_I$. For example, the wavelength $\lambda_I$ of the feedback is only returned to cell 101-1. When wavelength $\lambda_I$ of the feedback encounters filter 104-1, it is reflected by filter 104-1. However, all other wavelengths ($\lambda_2$ through $\lambda_N$) are transmitted by filter 104-1. Likewise, this process is repeated. Each filter 104-I reflects its own wavelength $\lambda_I$ and transmits all subsequent wavelengths ($\lambda_{I+1}$ through $\lambda_N$) on the feedback path.

It shall be appreciated that the wavelength(s) of the feedback provided to each laser diode 104-1 through 104-N controls the operating wavelength(s) of the laser diode. Since the wavelengths of the feedback to the respective laser diodes 104-1 through 104-N are determined by filters 104-1 through 104-N, the resonant wavelengths are determined by selecting the characteristics of the filters.

Figure 3:
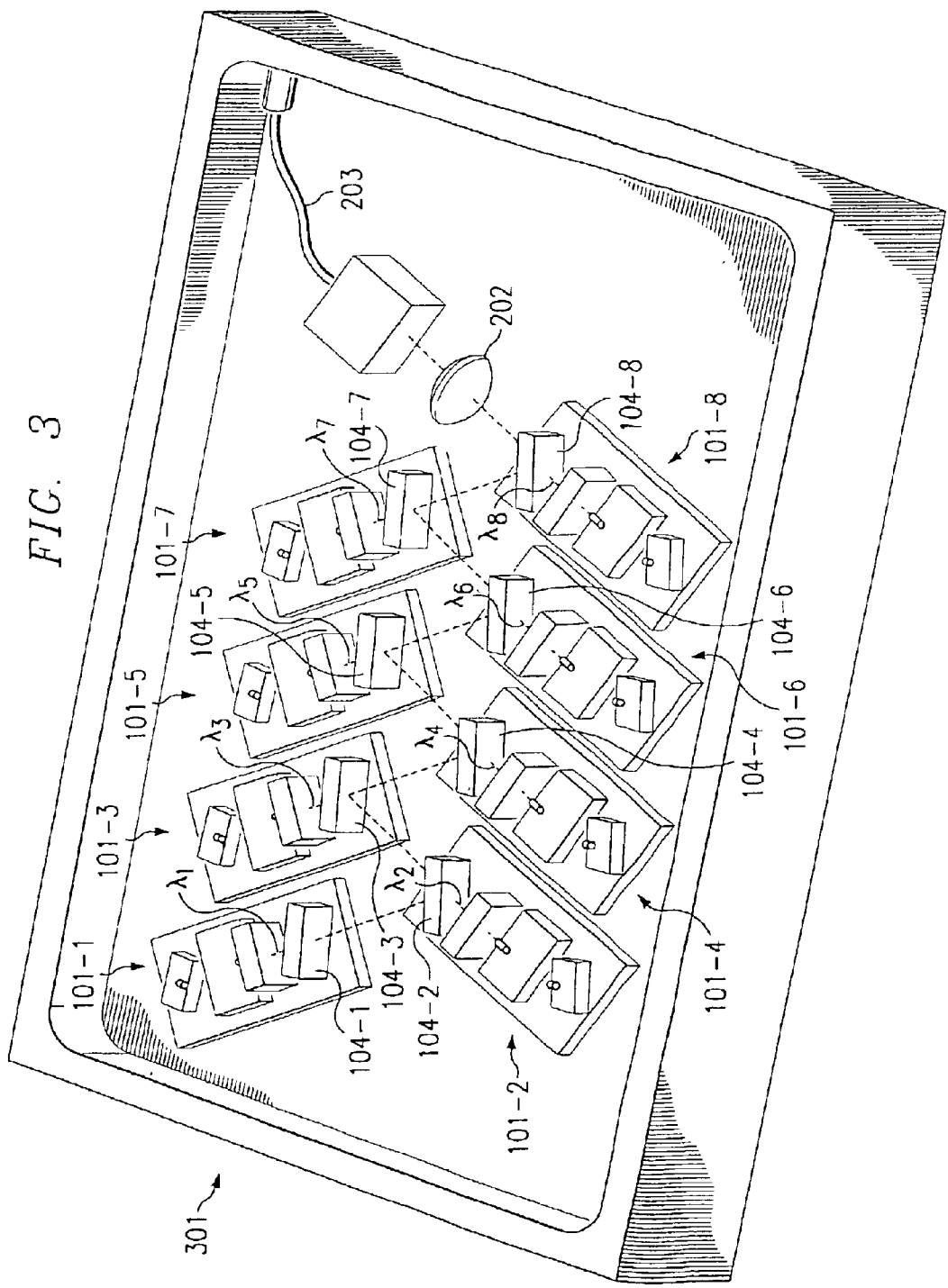
FIG. 3 depicts another incoherently beam combined laser according to embodiments of the present invention.

FIG. 3 depicts another embodiment of the present invention. As depicted in exemplary system 300 of FIG. 3, cells 101-1 through 101-8 are shown in an arrangement where the cells are disposed in an alternating or crisscross manner. Each filter 104 transmits the wavelength generated by its respective cell 101. Moreover, the filters 104-2 through 104-8 reflect the wavelengths associated with each preceding cell, i.e, filter 104-I reflects wavelengths $\lambda_1$ through $\lambda_{I-1}$. For example, filter 104-2 reflects wavelength $\lambda_1$, filter 104-3 reflects wavelengths $\lambda_1$ and $\lambda_2$, filter 104-4 reflects wavelengths $\lambda_1$, $\lambda_2$, and $\lambda_3$, etc.

By arranging cells 101-1 through 101-8 as shown in FIG. 3 and by appropriately selecting the optical characteristics of filters 104-1 through 104-8, the output beams of laser diodes 102-1 through 102-8 are directed towards fiber coupling lens 202. The output beams from cells 101-1 through 101-8 are multiplexed when the output beams are focused into fiber 203 by fiber coupling lens 202.

A partially reflective component (not shown) returns feedback to the laser diodes 102 of cells 101-1 through 101-8. Moreover, system 300 controls the feedback with filters 104-1 through 104-N such that the wavelength, $\lambda_I$, is returned to the same cell 104-I that emitted that wavelength, $\lambda_I$. For example, the wavelength $\lambda_8$ of the feedback is only returned to cell 101-8. When the wavelength $\lambda_8$ of the feedback encounters filter 104-8, it is transmitted by filter 104-8. However, all other wavelengths ($\lambda_1$ through $\lambda_7$) are reflected by filter 104-8. Likewise, this process is successively repeated. Each filter 104-I transmits its own wavelengths $\lambda_I$ and reflects all subsequent wavelengths ($\lambda_1$ through $\lambda_{I-1}$) on the feedback path.

It shall be appreciated that the number of cells 101 in a particular system are not limited according to the present invention. However, it shall be appreciated that each filter 104 provides a small degree of attenuation to the optical beams. Accordingly, it may be appropriate for a particular application, to limit the number of filters 104 that an optical beam may encounter. Furthermore, the practicalities of optical coatings will impose limitations on the proximity of wavelengths. In such applications, it may be appropriate to utilize a polarization multiplexer to combine outputs from a plurality of systems 200, systems 300, or other multiple cell 100 systems.

Figure 4A:
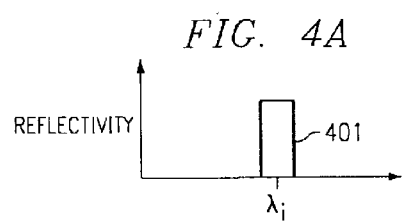
FIGS. 4A–4C depict wavelength responses that may utilized in an incoherently beam combined laser according to embodiments of the present invention.
Figure 4B:
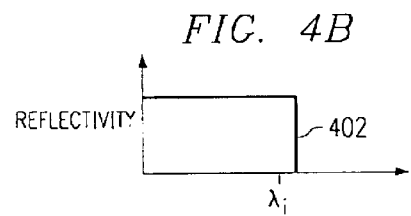
Figure 4C:
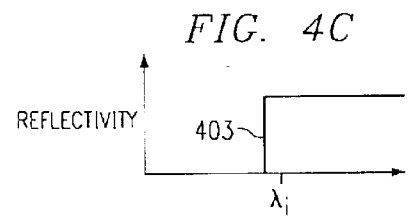

FIGS. 4A through 4C depict exemplary wavelength responses that may be utilized by filters 104 of system 200. Response 401 corresponds to a notch filter. Response 401 is substantially fully reflective at and adjacent to wavelength $\lambda_I$. However, response 401 is not appreciably reflective at other wavelengths (accordingly these other wavelengths are substantially transmitted). Responses 402 and 403 are step or edge responses. Response 402 may be substantially fully reflective at wavelength $\lambda_I$ and wavelengths less than $\lambda_I$ (other wavelengths are substantially transmitted). Similarly, response 403 is substantially fully reflective at wavelength $\lambda_I$ and wavelengths greater than $\lambda_I$ (other wavelengths are substantially transmitted). Responses 402 and 403 impose a monotonic arrangement of wavelengths when utilized for filters 104 according to system 200.

Figure 5A:
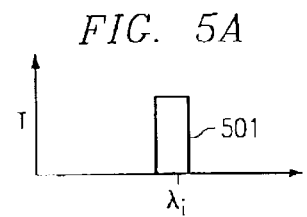
FIGS. 5A–5C depict other wavelength responses that may utilized in an incoherently beam combined laser according to embodiments of the present invention.
Figure 5B:
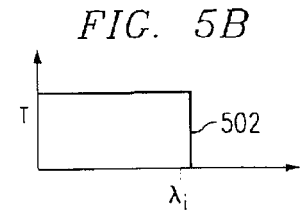
Figure 5C:
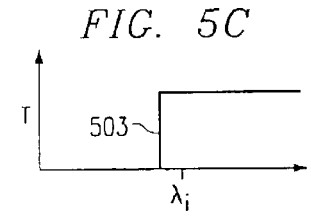

FIGS. 5A through 5C also depict exemplary wavelength responses that may be utilized by filters 104 of system 300. Response 501 corresponds to a notch filter. Response 501 is substantially fully transmissive at and adjacent to wavelength $\lambda_I$. However, response 501 is not appreciably transmissive at other wavelengths (accordingly these other wavelengths are substantially reflected). Responses 502 and 503 are step or edge responses. Response 502 is substantially transmissive at wavelength $\lambda_I$ and at wavelengths less than $\lambda_I$ (other wavelengths are substantially reflected). Similarly, response 503 is substantially transmissive at wavelength $\lambda_I$ and at wavelengths greater than $\lambda_I$ (other wavelengths are substantially reflected). Responses 502 and 503 impose a monotonic arrangement of wavelengths when utilized for filters 104 according to system 300.

It shall be appreciated that responses 401–403 and 501–503 are idealized responses as the first derivatives of responses are not continuous. Nonetheless, these responses may be approximated with suitable precision by utilizing multiple-film, thin-film filters. Accordingly, suitable filters 104 according to the embodiments of the present invention may be implemented by approximating one of responses 401–403 or 501–503.

Figure 6A:
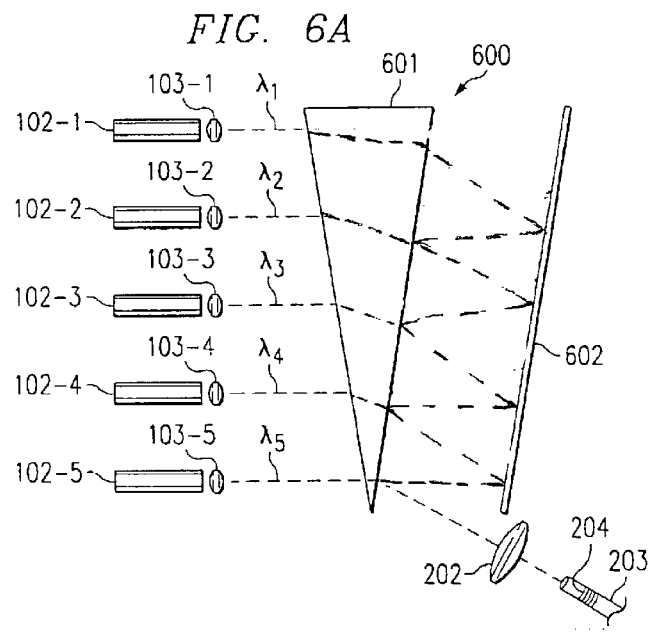
FIG. 6A depicts another incoherently beam combined laser according to embodiments of the present invention.
Figure 6B:
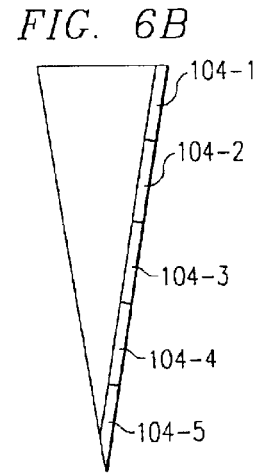
FIG. 6B depicts an optical wedge that may be utilized in an incoherently beam combined laser according to embodiments of the present invention.

FIG. 6A depicts an alternative embodiment of the present invention. System 600 comprises a plurality of laser diodes 102-1 through 102-5 with collimators 103-1 through 103-5. System 600 further comprises optical wedge 601 and fully reflective component 602. Optical wedge 601 and fully reflective component are operable to multiplex the output beams from laser diodes 102-1 through 102-5. As shown in greater detail in FIG. 6B, optical wedge 601 may be coated with a gradient dielectric films. The dielectric films may implement filters 104-1 through 104-5 so that each wavelength, $\lambda_I$ generated by laser diode 102-I, is substantially transmitted by filter 104-I. Also, filter 104-I advantageously substantially reflects the wavelengths $(\lambda_I-\lambda_{I-1})$ generated by each previous laser diode (102-1 through 102-(I-1)). Accordingly, after each output beam exits optical wedge, it continues propagating along the common optical path between optical wedge 601 and fully reflective component 602. Eventually, the output beams may be coupled into fiber 204 by fiber coupling lens 202.

It shall be appreciated that the geometry of systems 200, 300, and 600 are merely exemplary as different configurations may be utilized. For example, it may be advantageous to disposes cells 101 in a three-dimensional arrangement such as helix type structure to obtain a more compact device.

It shall be appreciated that the multiplexing of the output beams from cells 101 in system 200, system 300, and system 600 occurs by precisely positioning the optical components to cause the respective beams to overlap. The positioning of the various optical components may occur manually. However, it shall be appreciated that pick-and-place mechanics and machine vision techniques may be utilized to precisely position the optical components according to embodiments of the present invention. By utilizing pick-and-place mechanics and machine vision techniques, suitable high power lasers may be built in a rapid and cost efficient manner.

Referring now to FIG. 7, system 700 depicts an exemplary arrangement to combine the output from a plurality of systems 200 (shown as systems 200-a and 200-b). Although systems 200 are shown, it shall be appreciated that systems 300, systems 600, or other suitable systems according to the present invention may be utilized in lieu of systems 200. System 200-a generates a multiplexed output consisting of wavelengths $\lambda_1$ through $\lambda_N$ and system 200-b generates a multiplexed output consisting of wavelengths $\lambda_{N+1}$ through $\lambda_{N+M}$. The multiplexed outputs of systems 200-a and 200-b are provided to polarization beam combiner 201. The multiplexed outputs are coupled into fiber 204 by fiber coupling lens 202. Fiber Bragg grating 203 provides feedback to laser diodes 102 of systems 200-a and 200-b. In some situations, it may be more advantageous to utilize system 700 to achieve increased output power as compared to implementing additional cells 101 in a single system 200. Specifically, a certain amount of attenuation may occur at each filter 104. Accordingly, system 700 may operate more efficiently for greater numbers of cells 101 than a single system 200.

FIG. 8 depicts exemplary optical system 800 which includes a Raman amplifier according to embodiments of the present invention. Optical system 800 includes optical signal source 801 which generates an optical signal to be detected by detector 802. Detector 802 is disposed at some appreciable distance from optical signal source 801. The optical signal generated by optical signal source 801 experiences attenuation in optical fibers 804 and 805. Accordingly, it is desirable to amplify the optical signal generated by optical signal source 801. To perform such amplification, system 800 utilizes system 200 to provide a Raman pump to multiplexer 803. Specifically, the output wavelengths of system 200 are controlled by selecting the characteristics of filters 104 of system 200. Additionally, the output power of system 200 at the respective wavelengths may be controlled to spectrally tailor the Raman pump. Multiplexer 803 causes the Raman pump to enter optical fiber 805 which also carries the optical signal generated by optical signal source 801. Due to SRS, the optical signal experiences Raman gain at the desired wavelength(s) in fiber 805. Additionally, by spectrally tailoring the Raman pump (system 200), the amplification of the optical signal is substantially flat, which is desirable if the signal is a WDM or DWDM signal.

Embodiments of the present invention provide several advantages. First, embodiments of the present invention do not require excessive amounts of semiconductor material as a unitary emitter array may require. Specifically, if a large number of emitters are implemented on a single array, a minimum amount of space is required between adjacent emitters to dissipate sufficient thermal energy to avoid degradation of emitter performance. To provide sufficient space on an emitter array, additional semiconductor material is required between adjacent emitters. Accordingly, embodiments of the present invention may utilize less expensive laser diode semiconductor devices to reduce the cost of high power laser devices.

Moreover, embodiments of the present invention may utilize laser diodes of differing capabilities for different wavelengths. For example, laser diodes, that possess quantum wells associated with different center wavelengths, may be utilized. By matching the center wavelengths associated with laser diodes 102 with the wavelength responses of filters 104, the operating efficiency of laser diodes 102 may be improved. Additionally, Raman pump applications require high power at wavelengths at both ends of the pump spectrum. However, lower power is required at wavelengths in the middle of the pump spectrum. Accordingly, laser diodes, that possess lower power capabilities and that are, hence, less expensive, may be utilized for wavelengths corresponding to lower power requirements.

Additionally, it shall be appreciated that embodiments of the present invention provide greater manufacturing yields than unitary emitter arrays. For example, if a unitary emitter array includes ten emitters and the probability of a single emitter satisfying specification requirements is 0.9, the probability that all ten of the emitters on the unitary emitter array will satisfy the specification requirements is $(0.9)^{10}$, which is clearly quite small. However, according to embodiments of the present invention, the laser diodes are not physically integrated on a single chip. If a single laser diode is inoperable, it may be replaced with another laser diode. Accordingly, manufacturing yields are greatly improved.

Additionally, it shall be appreciated that embodiments of the present invention may possess greater bandwidth than known incoherently beam combined (IBC) laser devices. Specifically, the geometric constraints of IBC lasers (imposed by the dispersive element and the collimating optic) limit the bandwidth of the IBC lasers. However, this is problematic if a known IBC laser is utilized as a Raman pump. Specifically, amplification may be required over one or more telecommunication bands (e.g., S Band (1480 to 1525 nm), C Band (1530 to 1565 nm), L Band (1570 to 1610 nm), XL Band (1615 to 1660 nm)). A bandlimited IBC laser would not be capable of generating sufficient bandwidth to create reasonably flat gain over one or more of these bands. However, the bandwidth of embodiments of the present invention is not limited by their geometry. Instead, the bandwidth is only limited by the intrinsic bandwidth of the laser diodes and the characteristics of the selected filters. Accordingly, the bandwidth may be adjusted as desired to achieve reasonably flat Raman gain across one or more telecommunication bands.

Another issue with known IBC lasers is that the feedback provided to a particular emitter of an emitter array is highly peaked due to the dispersive element and the various optical components. Accordingly, the particular emitters tend to lase at either one particular longitudinal mode or wavelength. By causing the filter response of filter 104 to be substantially flat near selected wavelengths, laser diodes according to embodiments of the present invention may operate at several longitudinal modes or closely spaced wavelengths improving laser performance.

Figure 9B:
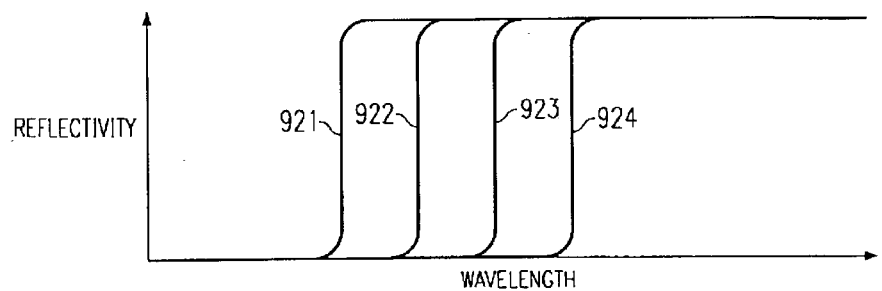
FIG. 9B depicts wavelength responses that may utilized in an incoherently beam combined laser according to embodiments of the present invention.

FIG. 9A depicts a plurality of plates 901–904 that may be utilized to fabricate component for use in an IBC laser according to embodiments of the present invention. Each of plates 901–904 are coated with a thin dielectric film or films (shown as films 911–914). The reflectivity of each of films 911–914 as a function of wavelength is shown in FIG. 9B (as reflectivity responses 921–924). As shown by the reflectivity responses in FIG. 9B, each of films 911–914 are highly reflective for wavelengths longer than a respective predetermined wavelength. The plurality of plates 901–904 may be diced or suitable cut along axes 951–955. Axes 951–955 may be advantageously oriented at a forty-five degree angle with respect to plates 901–904. By cutting plates 901–904 in this manner, a plurality of optical components (960-1 through 9604 as shown in FIG. 9A) may be fabricated.

Figure 10:
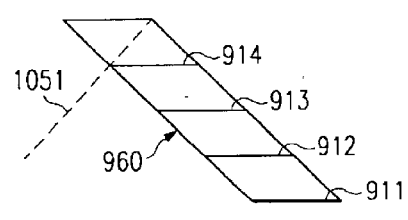
FIG. 10 depicts processing of an optical component for use in an incoherently beam combined laser according to embodiments of the present invention.
Figure 11:
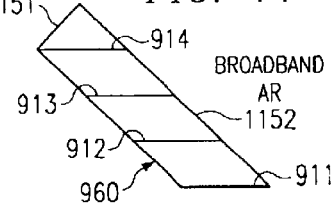
FIG. 11 depicts further processing of an optical component for use in an incoherently beam combined laser according to embodiments of the present invention.

An additional cut may be applied to each of optical components 960-1 through 960-4. As shown in FIG. 10, optical component 960 may be cut along axis 1051. After the additional cuts are made, additional coatings may be applied. As shown in FIG. 11, optical component 960 may be coated to provide broadband partial reflector 1151. Also, optical component 960 may be coated to provide broadband reflector 1152.

Figure 12:
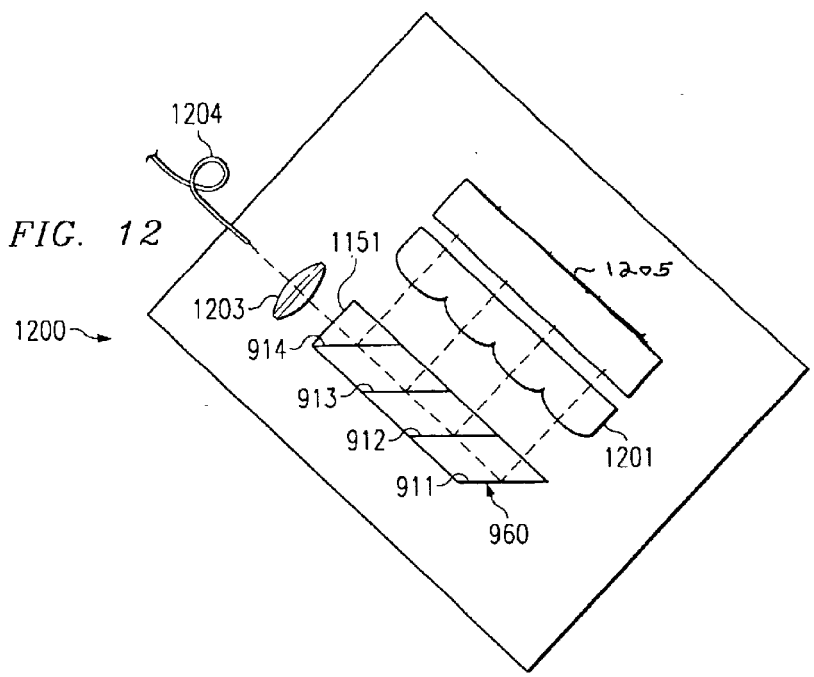
FIG. 12 depicts an incoherently beam combined laser that comprises the optical component processed according to FIGS. 10 and 11 according to embodiments of the present invention.

At this point, optical component 960 is suitable for implementation of an IBC laser according to embodiments of the present invention. FIG. 12 depicts IBC laser 1200 that includes optical component 960 according to embodiments of the present invention. IBC laser 1200 comprises integrated emitter array 1205 which provides its output beams to micro-lens array 1201 to collimate the output beams. Each respective emitter beam is reflected by one of films 911 through 914 thereby multiplexing the beams. Additionally, the external cavity of IBC laser 1200 is completed by partial reflector 1151 which provides feedback to each of emitters 901-1 through 901-4. Also, it shall be appreciated that the respective wavelength of the feedback provided to each of emitters 901-1 through 901-4 is determined by the reflectivity of surfaces 911 through 914. The portion of the optical power that is not reflected by partial reflector 1151 may be coupled into fiber 1204 by fiber coupling lens 1203.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for incoherently beam combining output beams from a plurality of laser diodes, comprising:
   a plurality of laser diode cells, each laser diode cell comprising a laser diode and an optical filter;
   said plurality of laser diode cells being disposed in association with a common optical path;
   each laser diode of said plurality of laser diode cells operable to produce an output bean;
   each filter of said plurality of laser diode cells being operable to allow the respective output beam generated by the laser diode of its laser diode cell to enter the common optical path;
   each filter of said plurality of laser diode cells being operable to allow the respective output beams generated by the laser diodes of prior laser diode cells on the common optical path to continue propagating along said common optical path; and
   a partial reflector disposed along said common optical path and operable to provide feedback to each laser diode of said plurality of laser diode cells, wherein said partial reflector and said filters of said plurality of laser diode cells define respective distinct resonant modes of the laser diodes of said plurality of laser diode cells.

2. The system of claim 1 wherein each output beam comprises at least one wavelength.

3. The system of claim 2 wherein each filter is operable substantially to transmit said at least one wavelength of the output beam generated by the laser diode of its laser diode cell.

4. The system of claim 2 wherein each filter is operable substantially to reflect said at least one wavelength of the output beam generated by the laser diode of its diode cell.

5. The system of claim 1 wherein each filter of said plurality of laser diode cells is a thin-film dielectric filter.

6. The system of claim 1 wherein each filter of said plurality of laser diode cells is a high-pass wavelength filter.

7. The system of claim 1 wherein each filter of said plurality of cells is a low-pass wavelength filter.

8. The system of claim 1 wherein each filter of said plurality of cells is a notch wavelength filter.

9. The system of claim 1 wherein each filter of said plurality of cells possesses a substantially flat wavelength response for a selected portion of spectrum.

10. The system of claim 9 wherein each laser diode of said plurality of laser diode cells is operable to lase at more than one wavelength.

11. The system of claim 1 further comprising:
   a Raman pump medium operable to amplify an optical signal;
   a multiplexer operable to provide the output beams from said laser diodes of said plurality of laser diode cells to said Raman pump medium to amplify said optical signal.

12. The system of claim 1 further comprising:

an Erbium Doped Fiber Amplifier (EDFA) operable to amplify an optical signal;

a multiplexer operable to providing the output beams from said laser diodes of said plurality of laser diode cells to said EDFA to amplify said optical signal.

13. The system of claim 1 wherein each laser diode cell of said plurality of laser diode cells comprises a collimator to collimate the output beam generated by the laser diode of the respective laser diode cell.

14. The system of claim 1 further comprising:

an optical fiber; and a fiber coupling lens operable to couple output beams generated by the laser diodes of said plurality of laser diode cells into said optical fiber.

15. The system of claim 1 wherein said partial reflector is embedded in said optical fiber.

16. The system of claim 15 wherein said partial reflector is a fiber Bragg grating.

17. A method for incoherently beam combining output beams from a plurality of laser diodes, comprising:

disposing a plurality of laser diodes in association with a common optical path;

disposing a plurality of optical filters in association with said common optical path;

operating said plurality of laser diodes to produce a respective output beam from each laser diode of said plurality of laser diodes, wherein each of said respective output beams is first incident on a respective filter of said plurality of filters, wherein said respective filter allows said respective output beam to enter said common optical path, and wherein respective filter allows other output beams to continue propagating along said common optical path; and providing feedback to said plurality of laser diodes by a partial reflector disposed alone said common optical path, wherein said partial reflector and said plurality of optical filters of said define respective distinct resonant modes of the plurality of laser diodes.

18. The method of claim 17 further comprising:

coupling said respective output beams into an optical fiber.

19. The method of claim 17 wherein said partial reflector is embedded in an optical fiber.

20. The method of claim 19, wherein said partial reflector is a fiber Bragg grating.

21. The method of claim 17 wherein at least one filter of said plurality of filters reflects the output beam of one of said plurality of laser diodes and said at least one transmits output beams of other ones of said plurality of laser diodes.

22. The method of claim 17 wherein at least one filter of said plurality of filters transmits the output beam of one of said plurality of laser diodes and said at least one filter reflects output beams of other ones of said plurality of laser diodes.

23. The method of claim 17 wherein each filter of said plurality of filters is a high-pass wavelength filter.

24. The method of claim 17 wherein each filter of said plurality of filters is a low-pass wavelength filter.

25. The method of claim 17 wherein each filter of said plurality of filters is a notch wavelength filter.

26. The method of claim 17 wherein each filter of said plurality of filters is substantially flat over a selected portion of spectrum.

27. The method of claim 17 further comprising:

providing said output beams of said plurality of laser diodes to a gain medium to amplify an optical signal.

28. The method of claim 27 wherein said gain medium is a Raman gain medium.

29. The method of claim 27 wherein said gain medium is an Erbium Doped Fiber.

30. A system for incoherently beam combining output beams, comprising:

an integrated emitter array that is operable to generate a plurality of output beams from a plurality of emitters;

a plurality of filters that are disposed in association with said integrated emitter array to define a common optical path for said plurality of output beams;

each filter of said plurality of filters being operable to reflect a respective output beam of said plurality of output beams from a respective emitter of said plurality of emitters to cause said respective output beam to propagate along said common optical path;

each filter of said plurality of filters being operable to transmit other output beams of said plurality of output beams to permit said other output beams to continue propagating along said common optical path; and a partial reflector disposed along said common optical path and operable to provide feedback to each of said plurality of emitters, wherein said partial reflector and said plurality of filters define respective distinct resonant modes of each of said plurality of emitters.

31. The system of claim 30 wherein each filter of said plurality of filters is a low-pass filter.

32. The system of claim 30 wherein each filter of said plurality of filters is a high-pass filter.

33. The system of claim 30 wherein each filter of said plurality of filters is a notch filter.

34. The system of claim 30 wherein each of said filters is a thin film dielectric coating applied on a respective plate of a plurality of mechanically coupled plates.

35. The system of claim 34 wherein one side of said plurality of mechanically coupled plates is coated with an anti-reflective coating.

36. The system of claim 34 wherein one side of said plurality of mechanically coupled plates is coated with a broadband reflective coating.

37. The system of claim 30 further comprising:

an amplifying medium that is operable to amplify an optical signal;

a multiplexer that is operable to provide said plurality of output beams to pump said amplifying medium to facilitate amplification of said optical signal.

38. The system of claim 30 further comprising:

a micro-lens array that is operable to collimate said plurality of output beams.

* * * * *